United States Patent
Maeda (12)

(10) Patent No.: US 6,195,879 B1
(45) Date of Patent: Mar. 6, 2001

(54) METHOD FOR MOUNTING WIRE-WOUND COMPONENT ON A PRINTED CIRCUIT BOARD

(75) Inventor: Osamu Maeda, Osaka (JP)

(73) Assignee: Funai Electric Company, Ltd., Osaka (JP)

(*) Notice: Subject to any disclaimer, the term of this patent is extended or adjusted under 35 U.S.C. 154(b) by 0 days.

(21) Appl. No.: 09/287,723

(22) Filed: Apr. 7, 1999

Related U.S. Application Data

(62) Division of application No. 08/785,874, filed on Jan. 21, 1997, now Pat. No. 6,018,285.

(30) Foreign Application Priority Data

Jan. 23, 1996 (JP) .......................................... 8-145

(51) Int. Cl.[7] .................................................. H05K 3/34
(52) U.S. Cl. ................................... 29/840; 29/839; 29/741
(58) Field of Search ............................. 29/840, 839, 852, 29/741

(56) References Cited

U.S. PATENT DOCUMENTS

| | | | |
|---|---|---|---|
| 4,506,443 | * | 3/1985 | Itoh .......................................... 29/840 |
| 5,966,804 | * | 10/1999 | Scola et al. ............................. 29/840 |

FOREIGN PATENT DOCUMENTS

| | | | |
|---|---|---|---|
| 56-116609 | * | 9/1981 | (JP) . |
| 62-203308 | * | 9/1987 | (JP) . |
| 62-203310 | * | 9/1987 | (JP) . |
| 4-171803 | * | 6/1992 | (JP) . |
| 7-037630 | * | 2/1995 | (JP) . |
| 7-038219 | * | 2/1995 | (JP) . |
| 7-038260 | * | 2/1995 | (JP) . |
| 7-058432 | * | 3/1995 | (JP) . |
| 7-074448 | * | 3/1995 | (JP) . |

OTHER PUBLICATIONS

AT&T Technologies, "Improved Coil Bobbin", Technical Digest No. 76, Mar. 1985, Dickens et al., pp. 19–20.*

* cited by examiner

*Primary Examiner*—Lee Young
*Assistant Examiner*—Rhonda E. Sands
(74) *Attorney, Agent, or Firm*—Lackenbach Siegel

(57) ABSTRACT

A wire-wound component to be mounted on a printed circuit board. The wire-wound component is formed by winding a wire on the body of the wire-wound component and by winding both end portions of the wire on terminals. The terminals and the body of the wire-wound component are formed as one unit by molding a heat-resistant resin material. The molded terminals, on which both end portions of the wire are wound, are inserted into the printed circuit board, and then connected to a circuit pattern on the printed circuit board by soldering.

2 Claims, 3 Drawing Sheets

METHOD FOR MOUNTING WIRE-WOUND COMPONENT ON A PRINTED CIRCUIT BOARD

RELATED PATENT APPLICATION

This patent application is a division of my U.S. patent application Ser. No. 08/785,874, filed Jan. 21, 1997, now U.S. Pat. No. 6,018,285, granted Jan. 25, 2000.

BACKGROUND OF THE INVENTION

1. Field of the Invention

This invention relates to an improvement in structure of a wire-wound component such as a transformer, a line filter, and a coil element which is to be mounted on a printed circuit board.

2. Discussion of the Related Art

A conventional wire-wound component is of resin, and metal terminals are fixedly press-fitted in the periphery of the body of the wire-wound component (hereinafter referred to as "component body", when applicable), and a metal wire is wound around the component body and its two end portions are wound around the metal terminals, to form the aimed wirewound component. In mounting the wire-wound component on a printed circuit board, the metal terminals are inserted into the printed circuit board and soldered to the circuit; or the wire-wound component has a mounting section which is secured to the printed circuit board, and the metal terminals of the wire-wound component are connected through lead wires to the circuit on the printed circuit board.

However, the above-described structure of the wire-wound component to be mounted on the printed circuit board suffers from the following difficulties:

It is necessary to provide special metal terminals which are used for the printed circuit board only, and to press-fit them in the component body, which increases the number of manufacturing steps and the manufacturing cost as much.

In the case where the metal terminals of the wire-wound component are connected through the lead wires to the circuit pattern on the printed circuit board, the number of connecting points is increased as much, which results in an increase in manufacturing cost.

SUMMARY OF THE INVENTION

In view of the foregoing, an object of the invention is to provide a wire-wound component to be mounted on a printed circuit board, the structure of which contributes to a reduction in the number of manufacturing steps and to a decrease in manufacturing cost.

In order to achieve the above object, the invention provides a wire-wound component to be mounted on a printed circuit board, comprising: a wire-wound component body on which a wire is wound; and a molded terminal on which an end portion of the wire is wound, the molded terminal and the wire-wound component body being formed as one unit by molding a heat-resistant resin material.

DETAILED DESCRIPTION OF THE PREFERRED EMBODIMENTS

Figure 1:
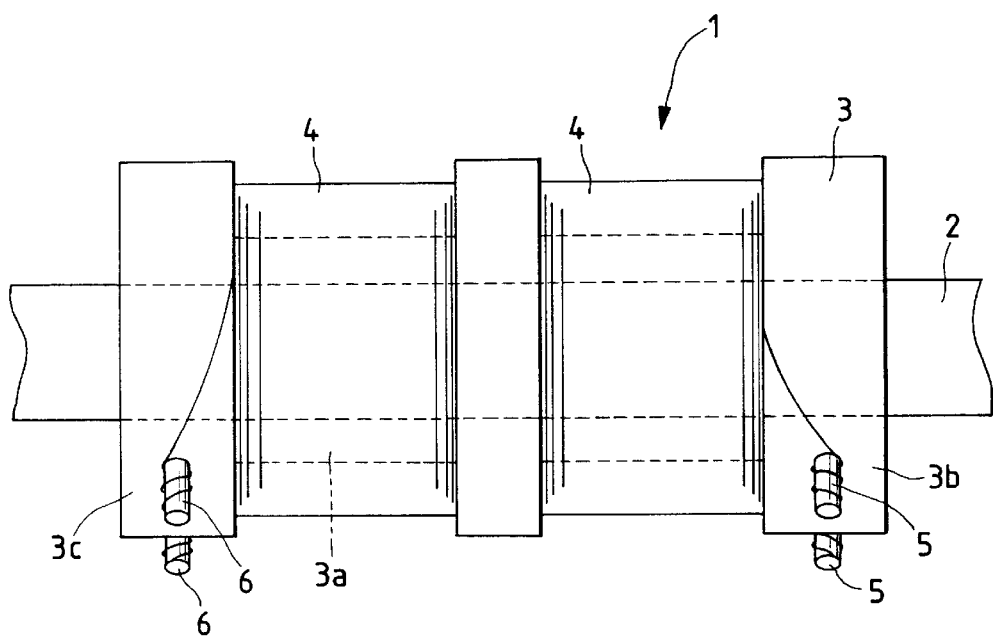
FIG. 1 is a front view showing an AC line filter turned slightly around the axis, which constitutes a preferred embodiment of the invention.

One preferred embodiment of the invention will be described with reference to FIGS. 1 and 2(A) to 2(E).

In FIGS. 1 and 2(A) to 2(E), reference numeral 1 designates a wire-wound component, namely, an AC line filter, which is the embodiment of the invention. The AC line filter 1 comprises: a ferrite core 2; a bobbin 3 of a heat-resistant resin material (polyethylene terephthalate in the embodiment) into which the ferrite core 2 is inserted; and two pieces of metal wire 4 wound on the bobbin 3. The bobbin 3 includes: a bobbin body 3a on which two winding sections are provided, the bobbin body 3a having two skirts 3b and 3c at both ends; and a pair of molded terminals 5 and 5 embedded in the skirt 3b, and another pair of molded terminals 6 and 6 embedded in the skirt 3c. One of the two pieces of metal wire 4 is wound on one of the winding sections of the bobbin 3, and with the end portions wound on the molded terminals 5 and 5, respectively; and the other piece of metal wire 4 is wound on the other winding section of the bobbin 3, and with the end portions wound on the molded terminals 6 and 6, respectively.

The detailed configuration of each of the molded terminals 5 and 6 and the steps of mounting each of those terminals on a printed circuit board 7 are shown in FIGS. 2(A) to 2(E).

FIGS. 2(A) to 2(E) show only the molded terminal 5 as a typical example of the molded terminals 5 and 6; however, it should be noted that the molded terminals 5 and 6 are equal in configuration to one another, and those molded terminals 5 and 6 are mounted on the printed circuit board 7 in the same manner.

Figure 2A:
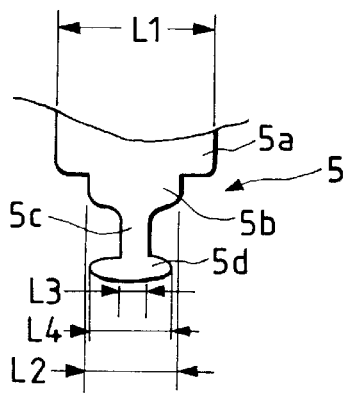
FIGS. 2(A), 2(B) and 2(C) are front views.

First, the molded terminal 5 is formed simultaneously when the bobbin body 3a is molded. The configuration of the molded terminal 5 is as shown in FIG. 2(A); that is, the molded terminal 5 includes: a base portion 5a which has a large diameter L1; a first removal preventing portion 5b which has an intermediate diameter L2; and a winding portion 5c which has a small diameter L3 (i.e., L1>L2>L3). The molded terminal 5 further includes a second removal preventing portion 5d which has a diameter L4 which is larger than the diameter L3 of the winding portion 5c and smaller than the diameter L1 of the base portion 5a (i.e., L1>L4>L3).

Figure 2B:
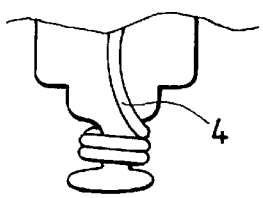
Figure 2C:
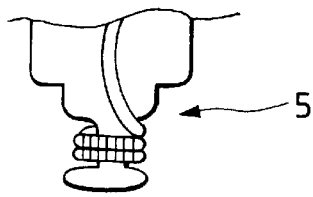

One end portion or the other end portion of the wire 4 is wound as shown in FIG. 2(B). Thereafter, the end portion wound on the molded terminal 5 is dipped in molten solder at a temperature of about 400° C., as a result of which it appears as shown in FIG. 2(C). This is to remove a film cover of polyurethane or the like from the end portion of the wire 4, and to apply solder to the surface of the end portion of the wire 4 to thereby convert the molded terminal 5 into a pseudo metal terminal.

Figure 2D:
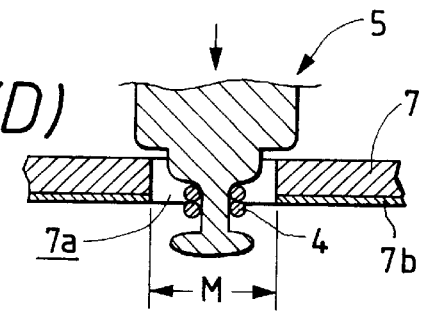
FIGS. 2(D) and 2(E) are sectional views, showing a molded terminal of the AC line filter in detail and indicating steps of mounting the molded terminal onto a printed circuit board.

Next, the end portion of the molded terminal 5 is inserted into a molded-terminal inserting hole 7a formed in the printed circuit board 7 as shown in FIG. 2(D). The diameter M of the hole 7a is larger than the diameters L2 and L4 of the first and second removal preventing portions 5b and 5d of the molded terminal 5, and smaller than the diameter L1 of the base portion 5a; that is, L1>M>L2 or L4. Hence, the insertion of the AC line filter 1, which is the wire-wound component, is stopped in such a manner that the first removal preventing portion 5b is inserted in the hole 7a and the base portion 5a is abutted against the printed circuit board 7; that is, the molded terminal 5 is positioned for a soldering operation which is carried out next. The printed circuit board 7 has a circuit pattern 7b on one side, on the lower surface in the case of FIG. 2(D) as viewed in the direction of insertion of the molded terminal 5.

Figure 2E:
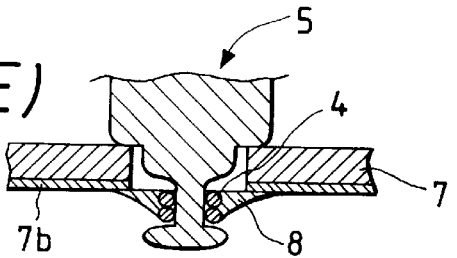

Finally, a dipping operation is carried out at a temperature in a range of 230–250° C. so that the end portion of the wire 4 wound on the molded terminal 5 is fixedly connected to the circuit pattern 7b through solder 8; that is, the wire 4 is electrically connected to the circuit pattern 7b, while the mounting of the AC line filter 1 on the printed circuit board 7 is accomplished, as shown in FIG. 2(E).

As was described above, after the end portion of the wire 4 is wound on the molded terminal 5, solder is applied to the end portion of the wire by dipping it in molten solder. Hence, the film is removed from the end portion of the wire 4, and the turns of the wire 4 wound on the molded terminal 5 are fixedly secured to one another by soldering. That is, the molded terminal 5 thus processed serves as a metal terminal. Hence, the molded terminal 5 can be readily secured to the printed circuit board 7.

The molded terminal 5, as was described before, includes the base portion 5a which is large in diameter, the first removal preventing portion 5b which is middle in diameter, the winding portion 5c which is small in diameter, and the second removal preventing portion 5d which is the end portion. Hence, the wire is prevented from coming off the molded terminal 5. On the other hand, since the diameter M of the hole 7a formed in the printed circuit board 7 meets the condition L1>M>L2 or L4, during the soldering operation the molded terminal 5 can be positioned with ease; that is, the soldering operation can be achieved positively and quickly.

While the preferred embodiment of the invention has been described, the invention is not limited thereto or thereby. That is, it may be changed or modified in various manner without departing from the subject matter of the invention. That is, the technical concept of the invention may be applied to various wire-wound components such as transformers and coils as well as the above-described AC line filter 1. Other than polyethylene terephthalate, phenol may be employed as the heat-resistant resin material. During the soldering operation, the molded terminal may be somewhat deformed or molten; more specifically it may be deformed or molten to the extent that it serves as a terminal. Hence, the material of the molded terminal may not be so high in heat resistance.

The soldering operation carried out after the wire has been wound on the molded terminal 5 as shown in FIG. 2(C), may be omitted depending on the required quality of the wire-wound component.

Figure 3A:
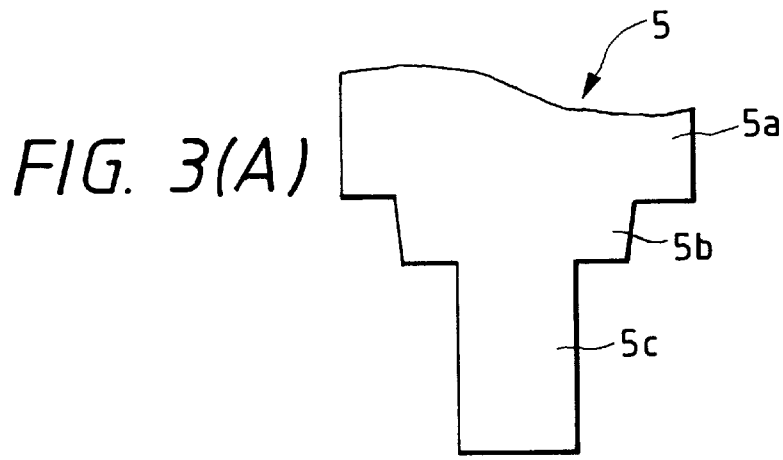
FIGS. 3(A), 3(B) and 3(C) are front views showing modifications of the molded terminal.
Figure 3B:
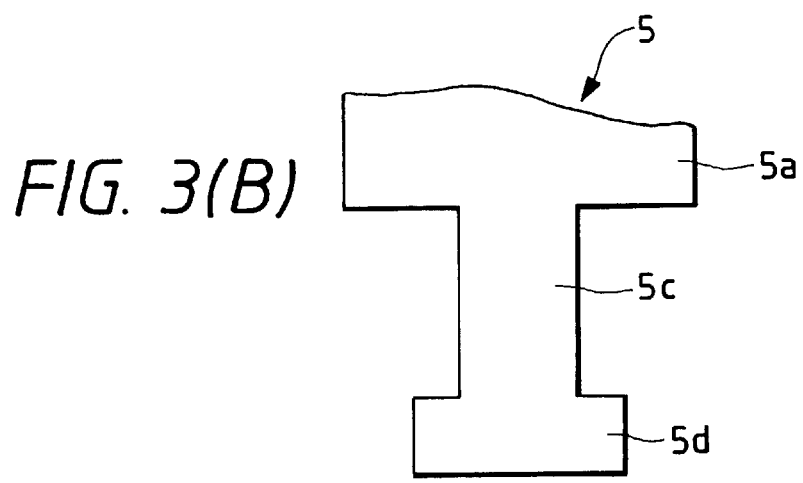
Figure 3C:
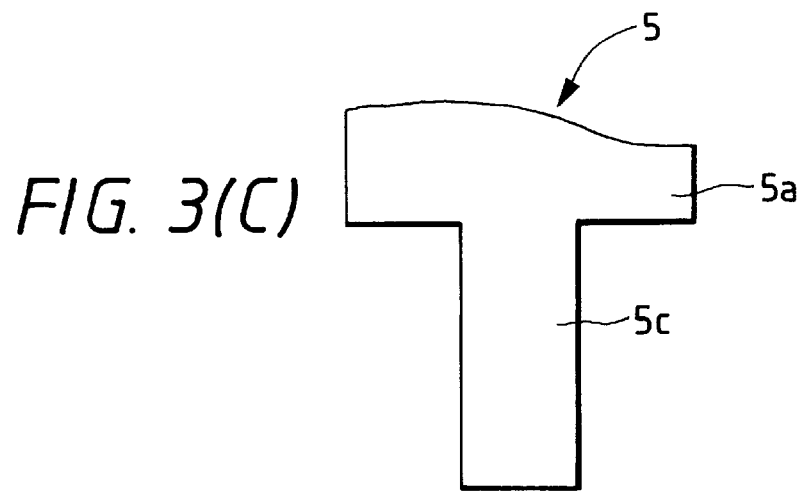

The molded terminal 5 or 6 may be modified in configuration as shown in FIGS. 3(A), 3(B) and 3(C). The molded terminal shown in FIG. 3(A) is obtained by removing the second removal preventing portion 5d from the molded terminal 5 shown in FIGS. 2(A) to 2(E). The molded terminal shown in FIG. 3(B) is obtained by removing the first removal preventing portion 5b from the molded terminal 5 shown in FIGS. 2(A) to 2(E). The molded terminal shown in FIG. 3(C) is obtained by removing the first and second removal preventing portions 5b and 5d from the molded terminal 5 shown in FIGS. 2(A) to 2(E).

As was described above, with the wire-wound component of the invention, it is unnecessary to use the metal terminals and to press-fit them, which reduces the number of manufacturing steps and manufacturing cost.

What is claimed is:

1. A method for mounting a wire-wound component body on a printed circuit board having a circuit pattern comprising the steps of:

winding and end portion of a wire a wire-wound component body on an end portion of a molded terminal, said molded terminal and said wire-wound component body being molded as one unit from a heat-resistant material;

fabricating said molded terminal with a base portion having a diameter L1; a first removal preventing portion having a diameter L2 which is smaller than said diameter L1 and extending from said base portion; a winding portion having a diameter L3 which is smaller than said diameter L2 and extending from said first removal preventing portion; and a second removal preventing portion as an end portion having a diameter L4 larger than diameter L3 but smaller than diameter L1 and extending from said winding portion;

wherein L1 is larger than a diameter M of a molded-terminal inserting hole formed in said printed circuit board, and said diameters L2 and L4 are smaller than diameter M;

inserting said molded terminal on which said end portion of said wire is wound into said printed circuit board;

and soldering said end portion of the wire wound on said molded terminal and said circuit pattern to each other.

2. The method as claimed in claim 1, further comprising removing a film cover from said end portion of said wire wound on said molded terminal before said inserting step.

* * * * *